United States Patent
Hayashi et al.

(10) Patent No.: US 9,070,864 B2
(45) Date of Patent: Jun. 30, 2015

(54) PIEZOELECTRIC VIBRATION DEVICE AND PORTABLE TERMINAL USING THE SAME

(75) Inventors: Harumi Hayashi, Kyoto (JP); Kenji Yamakawa, Kyoto (JP); Satoru Iwasaki, Kyoto (JP)

(73) Assignee: KOYCERA CORPORATION, Kyoto-Shi, Kyoto (JP)

( * ) Notice: Subject to any disclaimer, the term of this patent is extended or adjusted under 35 U.S.C. 154(b) by 48 days.

(21) Appl. No.: 13/993,897

(22) PCT Filed: Jul. 31, 2012

(86) PCT No.: PCT/JP2012/069417
§ 371 (c)(1),
(2), (4) Date: Jun. 13, 2013

(87) PCT Pub. No.: WO2013/046909
PCT Pub. Date: Apr. 4, 2013

(65) Prior Publication Data
US 2013/0259274 A1    Oct. 3, 2013

(30) Foreign Application Priority Data

Sep. 30, 2011  (JP) .................. 2011-217408
Oct. 28, 2011  (JP) .................. 2011-237455

(51) Int. Cl.
*H04R 25/00*    (2006.01)
*H01L 41/09*    (2006.01)
(Continued)

(52) U.S. Cl.
CPC ............. *H01L 41/0926* (2013.01); *H04M 1/03* (2013.01); *H04R 17/00* (2013.01); *H04R 7/045* (2013.01); *H04R 2499/11* (2013.01); *H04M 1/0266* (2013.01)

(58) Field of Classification Search
USPC .................... 381/190; 310/330, 311
See application file for complete search history.

(56) References Cited

U.S. PATENT DOCUMENTS 4,654,554 A * 3/1987 Kishi ..................... 381/190
4,969,534 A * 11/1990 Kolpe et al. ............... 181/130
(Continued)

FOREIGN PATENT DOCUMENTS

JP    2004-187031 A    7/2004
JP    2006-229506 A    8/2006
(Continued)

OTHER PUBLICATIONS

Korean Office Action with English concise explanation, Korean Patent Appln. No. 10-2013-7010421, May 19, 2014, 5 pp.

*Primary Examiner* — Ahmad F Matar
*Assistant Examiner* — Norman Yu
(74) *Attorney, Agent, or Firm* — Volpe and Koenig, P.C.

(57) ABSTRACT

A piezoelectric vibration device capable of being made thin and generating strong vibration, and a portable terminal using the same. Disclosed are a piezoelectric vibration device including at least: a support body; a vibration member that is mounted to the support body to be able to vibrate; a vibration element capable of being independently subjected to bending vibration by application of an electric signal; and a deformable first connecting member that is at least partly formed of a viscoelastic body, the deformable first connecting member being disposed between a first surface of the vibration element that is a bending surface and one main surface of the vibration member, and connecting the first surface of the vibration element and the one main surface of the vibration member, and a portable terminal using the piezoelectric vibration device.

6 Claims, 5 Drawing Sheets

(51) Int. Cl.
 *H04M 1/03* (2006.01)
 *H04R 7/04* (2006.01)
 *H01L 41/00* (2013.01)
 *H04R 17/00* (2006.01)
 *H04M 1/02* (2006.01)

(56) References Cited

U.S. PATENT DOCUMENTS 7,247,976 B2 * 7/2007 Sashida et al. ............. 310/330

2006/0194001 A1   8/2006 Kobayashi
2007/0169555 A1 * 7/2007 Gao et al. ................. 73/620
2010/0038998 A1 * 2/2010 Onishi et al. .............. 310/334

FOREIGN PATENT DOCUMENTS

| JP | 2006-238072 A | 9/2006 |
| JP | 2007-082009 A | 3/2007 |
| JP | 2011-148853 A | 8/2011 |

* cited by examiner

PIEZOELECTRIC VIBRATION DEVICE AND PORTABLE TERMINAL USING THE SAME

TECHNICAL FIELD

The present invention relates to a piezoelectric vibration device and a portable terminal using the same.

BACKGROUND ART

In the related art, a piezoelectric vibration device has been proposed, in which a plate-like piezoelectric bimorph element and a vibration plate are disposed with an interval and one end of the piezoelectric bimorph element in a length direction thereof, is fixed to the vibration plate (for example, refer to Patent Literature 1).

CITATION LIST

Patent Literature

Patent Literature 1: Japanese Unexamined Patent Publication JP-A 2006-238072.

SUMMARY OF INVENTION

Technical Problem

However, in the above-mentioned piezoelectric vibration device in the related art, since one end of the piezoelectric bimorph element in the length direction is fixed to the vibration plate, when an impact is applied thereto, stress is concentrated in the vicinity of the fixed end of the piezoelectric bimorph element, which often causes damage. Further, a piezoelectric vibration device has been proposed in which one main surface of a piezoelectric element is fixed to one main surface of a vibration plate and a connected body of the piezoelectric element and the vibration plate is subjected to bending vibration when the piezoelectric element is subjected to stretching vibration, but in such a piezoelectric vibration device, it is difficult to obtain strong vibration. Further, since it is necessary to rigidly fix the piezoelectric element and the vibration plate over a wide area, the piezoelectric element or the vibration plate is easy to be damaged due to thermal stress generated therebetween, or the like.

In order to solve the above described problem, an object of the invention is to provide a piezoelectric vibration device that is capable of generating strong vibration and is hard to be damaged, and a portable terminal using the same.

Solution to Problem

A piezoelectric vibration device of the invention comprises at least: a support body; a vibration member that is mounted to the support body to be able to vibrate; a vibration element capable of being independently subjected to bending vibration by application of an electric signal; and a deformable first connecting member that is at least partly formed of a viscoelastic body, the deformable first connecting member being disposed between a first surface of the vibration element that is a bending surface and one main surface of the vibration member, and connecting the first surface of the vibration element and the one main surface of the vibration member.

A portable terminal of the invention comprises at least: an electronic circuit; a display; the above-described piezoelectric vibration device; and a casing, the vibration member being the display, a part of the display, or a cover of the display, and the support body being fixed to the casing or at least a part of the casing being the support body.

Advantageous Effects of Invention

According to the piezoelectric vibration device of the invention, it is possible to obtain a piezoelectric vibration device that is capable of generating strong vibration and is hard to be damaged.

According to the portable terminal of the invention, it is possible to obtain a portable terminal that is capable of generating strong vibration and is hard to be broken down.

DESCRIPTION OF EMBODIMENTS

Figure 1:
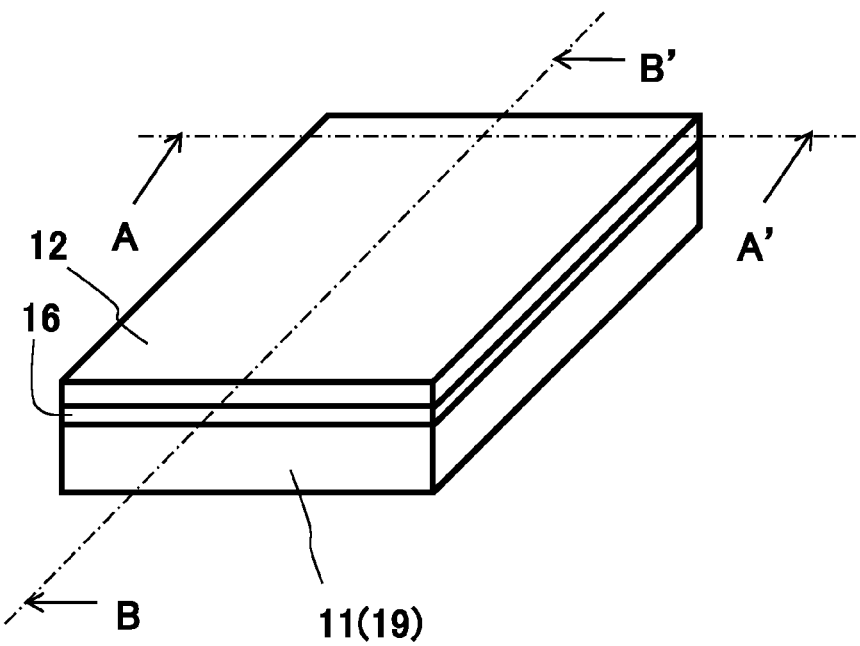
FIG. 1 is a perspective view schematically illustrating a piezoelectric vibration device and a portable terminal according to an embodiment of the invention.
Figure 2:
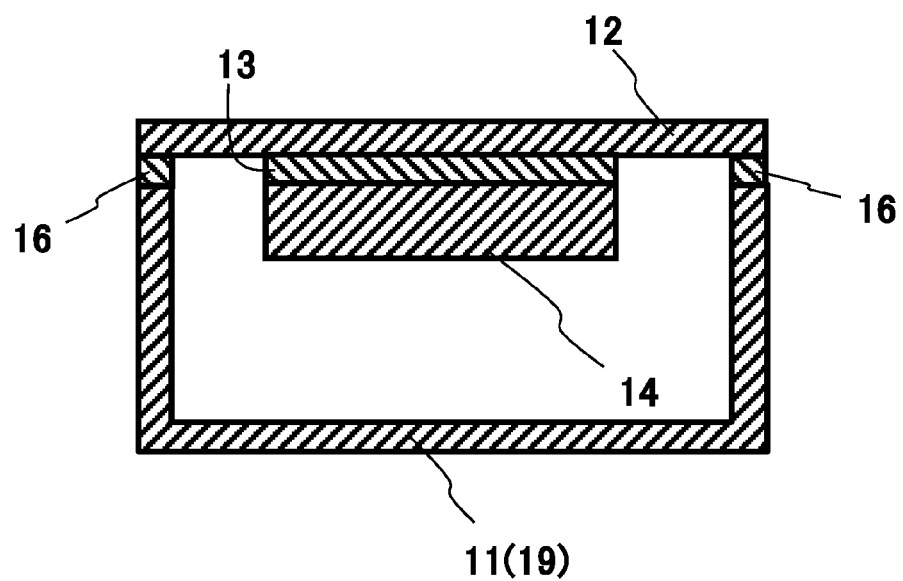
FIG. 2 is a cross-sectional view taken along the line A-A' in FIG. 1.
Figure 3:
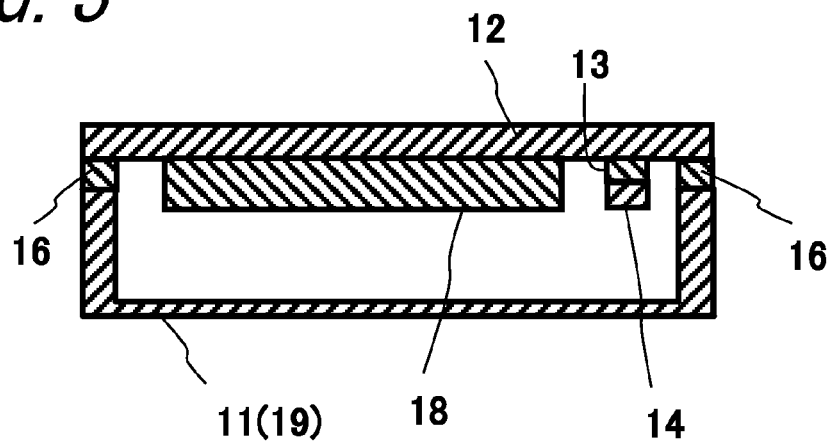
FIG. 3 is a cross-sectional view taken along the line B-B' in FIG. 1.

Hereinafter, a piezoelectric vibration device and a portable terminal according to the invention will be described in detail with reference to the accompanying drawings. FIG. 1 is a perspective view schematically illustrating a piezoelectric vibration device and a portable terminal according to an embodiment of the invention. FIG. 2 is a cross-sectional view taken along the line A-A' in FIG. 1. FIG. 3 is a cross-sectional view taken along the line B-B' in FIG. 1.

As shown in FIGS. 1 to 3, the piezoelectric vibration device of the embodiment includes a support body 11, a vibration plate 12, a first connecting member 13, a vibration element 14, and a second connecting member 16. Further, a portable terminal of the embodiment includes a display 18 and an electronic circuit (not shown), in addition to the piezoelectric vibration device. Here, the support body 11 of the piezoelectric vibration device functions as a casing 19 in the portable terminal, and the vibration plate 12 of the piezoelectric vibration device functions as a cover of the display 18 in the portable terminal.

The support body 11 has a box shape with one open surface. The support body 11 may be formed by favorably using a material having a high rigidity and elasticity such as a synthetic resin, for example. Further, the support body 11 functions as a support body that supports the vibration plate 12 to be able to vibrate in the piezoelectric vibration device, and functions as the casing 19 in the portable terminal.

The vibration plate 12 has a thin plate shape. The vibration plate 12 may be formed by favorably using a material having a high rigidity and elasticity such as an acrylic resin or glass. Further, the vibration plate 12 is fixed to the support body 11 through the second connecting member 16 only in the periphery of one main surface of the vibration plate 12, and is mounted to the support body 11 to be able to vibrate. The thickness of the vibration plate 12 is set to about 0.4 mm to 1.5 mm, for example.

The first connecting member 13 has a film shape, and has a thickness larger than amplitudes of bending vibration of the vibration element 14. Further, the first connecting member 13 is formed of a material that is softer than that of the vibration plate 12 and is easy to be deformed, and is lower than the vibration plate 12 in an elastic modulus or rigidity such as a Young's modulus, a rigidity modulus or a volume elasticity modulus. That is, the first connecting member 13 is deformable, and is greatly deformed compared with the vibration plate 12 when the same force is applied thereto.

Figure 4:
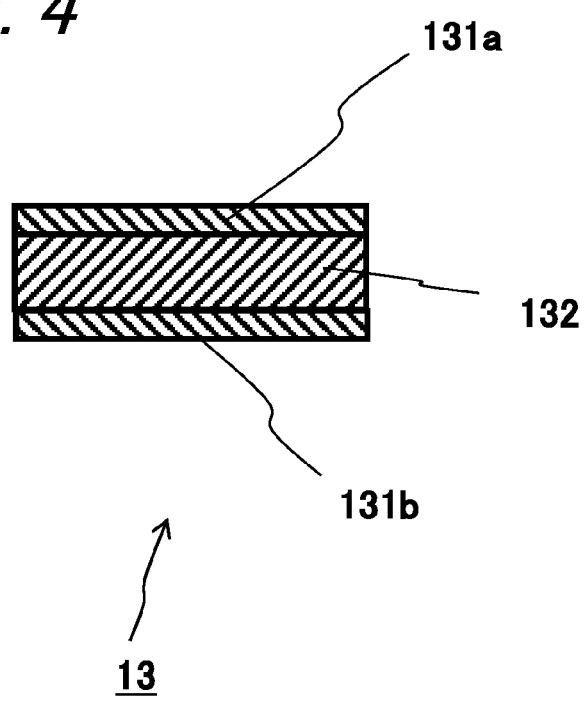
FIG. 4 is a cross-sectional view schematically illustrating a structure of a first connecting member 13 in FIGS. 1 to 3.

FIG. 4 is a cross-sectional view schematically illustrating a structure of the first connecting member 13. In FIG. 4, for easy understanding of a shape, a dimension of the first connecting member in a thickness direction thereof is enlarged to be shown. As shown in FIG. 4, the first connecting member 13 has a three-layer structure composed of two adhesive layers 131a and 131b and a base layer 132 disposed therebetween.

Further, one main surface (a surface on the adhesive layer 131a side) of the first connecting member 13 is entirely fixed to a part of one main surface of the vibration plate 12, and one main surface of the vibration element 14 is entirely fixed to the other main surface (a surface on the adhesive layer 131b side) of the first connecting member 13. That is, the vibration plate 12 and the vibration element 14 are connected to each other through the first connecting member 13.

The adhesive layers 131a and 131b are formed of a viscoelastic body, and the thickness thereof is set to about 10 µm to 30 µm, for example. As the viscoelastic body constituting the adhesive layers 131a and 131b, a known viscoelastic body formed of a high molecular material such as an acryl-based material, a silicone-based material, an urethane-based material or a rubber-based material may be appropriately used, for example.

The base layer 132 has a high rigidity compared with the adhesive layers 131a and 131b, and the thickness thereof is set to about 50 µm to 200 µm, for example. It is preferable that the base layer 132 is formed of the viscoelastic body constituting the adhesive layers 131a and 131b, and a non-woven fabric. That is, it is preferable that the base layer 132 is formed of a non-woven fabric in which the viscoelastic body constituting the adhesive layers 131a and 131b is impregnated (in which the viscoelastic body constituting the adhesive layers 131a and 131b is impregnated between fibers of the non-woven fabric). Accordingly, it is possible to obtain the first connecting member 13 that is at least partly formed of the viscoelastic body throughout the thickness direction thereof, that is, the first connecting member 13 in which the viscoelastic body is present in any cross section between the surface on the vibration element 14 side of the first connecting member 13 and the surface on the vibration plate 12 side of the first connecting member 13. Here, as a fiber used in the non-woven fabric, a natural fiber, a synthetic fiber, a glass fiber, a metal fiber or the like may be exemplified. The base layer 132 may be formed of resin, for example. As the resin, polyester, polyethylene, urethane resin, acrylic resin or the like may be exemplified. Further, the base layer 132 may be formed of a foam of the above-mentioned resin.

The vibration element 14 has a plate shape, and one main surface thereof is entirely fixed to the other main surface of the first connecting member 13. The vibration element 14 is a stacked body formed by stacking a plurality of polarized piezoelectric layers and a plurality of electrode layers, in which the electrode layers and the piezoelectric layers are alternately stacked. Thus, one end surface of the vibration element 14 in a stacking direction of the plurality of piezoelectric layers and electrode layers is entirely fixed to the other main surface of the first connecting member 13. That is, one end surface (main surface) of the vibration element 14 in the stacking direction of the plurality of piezoelectric layers is entirely connected to one main surface of the vibration plate 12 through the first connecting member 13.

Further, the vibration element 14 is configured so that a polarization direction according to a direction of an electric field applied at a certain instant is reversed to occupy a half on one side and a half on the other side in the thickness direction of the vibration element 14. That is, for example, when a half on one side of the vibration element 14 in the thickness direction is extended in the length direction of the vibration element 14 at a certain instant by application of an electric signal, a half on the other side of the vibration element 14 in the thickness direction is contracted in the length direction of the vibration element 14. Accordingly, the vibration element 14 may be independently subjected to bending vibration by application of an electric signal. In this way, the vibration element 14 is configured by a piezoelectric body having a bimorph structure (piezoelectric bimorph element).

The vibration element 14 is subjected to bending vibration so that one main surface and the other main surface thereof are bent. Accordingly, the first connecting member 13 is disposed between a first surface (one main surface) that is a bending surface of the vibration element 14 and one main surface of the vibration plate 12, to connect the first surface of the vibration element 14 and one main surface of the vibration plate 12. That is, the first connecting member 13 causes the first surface of the vibration element 14 to be entirely fixed to the vibration plate 12. Here, the entirely fixed (connected) state includes a state where the entire surface of the first surface (one main surface) of the vibration element 14 is fixed (connected) and a state where an approximately entire surface thereof is fixed (connected). Further, the thickness of the first connecting member 13 is set to be larger than the amplitudes of bending vibration of the vibration element 14, and is set so as to avoid excessive attenuation of vibration ascribable to too large a thickness. For example, the thickness is set to about 0.1 mm to 0.6 mm.

The vibration element 14 has a rectangular parallelepiped shape of 15 mm to 40 mm in length, 2 mm to 5 mm in width, and 0.3 mm to 1.0 mm in thickness, for example. The piezoelectric layer constituting the vibration element 14 may be formed by favorably using lead zirconate (PZ), lead zirconate titanate (PZT), or a non-lead based piezoelectric material such as a Bi layered compound or a tungsten bronze structure compound, for example, but other piezoelectric materials may be used. The thickness of one piezoelectric layer is preferably set to about 0.01 mm to 0.1 mm in consideration of low voltage driving. Further, in order to obtain large bending vibration, it is preferable to have a piezoelectric constant d31 of 200 µm/V or higher. The electrode layer constituting the vibration element 14 may be formed by favorably using a material containing a ceramic component or a glass component in addition to a metallic component such as silver or alloy of silver and palladium, for example, but may be formed by using other known metallic materials.

The vibration element 14 having such a configuration may be manufactured by the following method, for example. First, a binder, a dispersing agent, a plasticizer and a solvent are added to powder of a piezoelectric material, and the mixture is stirred to manufacture slurry. Then, the obtained slurry is molded in a sheet form to manufacture a green sheet. Then, conductive paste is printed on the green sheet to form an electrode layer pattern. Then, the green sheets bearing the electrode layer patterns are stacked on top of each other to manufacture a stacked molded product. After that, the stacked molded product is subjected to degreasing treatment and firing process, and is then cut into a predetermined dimension, whereupon a stacked body can be obtained. Next, after the printing of a conductor paste for the formation of the surface electrode with subsequent baking process at a predetermined temperature, a direct-current voltage is applied to the stacked body through the electrode layer to effect polarization of the piezoelectric layers. In this way, the vibration element 14 can be obtained.

The second connecting member 16 has a film shape, and has a thickness larger than the amplitudes of bending vibration of the vibration element 14. Further, the second connecting member 16 is formed of a material that is softer than that of the vibration plate 12 and is easy to be deformed, and is lower than the vibration plate 12 in an elastic modulus or rigidity such as a Young's modulus, a rigidity modulus or a volume elasticity modulus. That is, the second connecting member 16 is deformable, and is greatly deformed compared with the vibration plate 12 when the same force is applied thereto.

Figure 5:
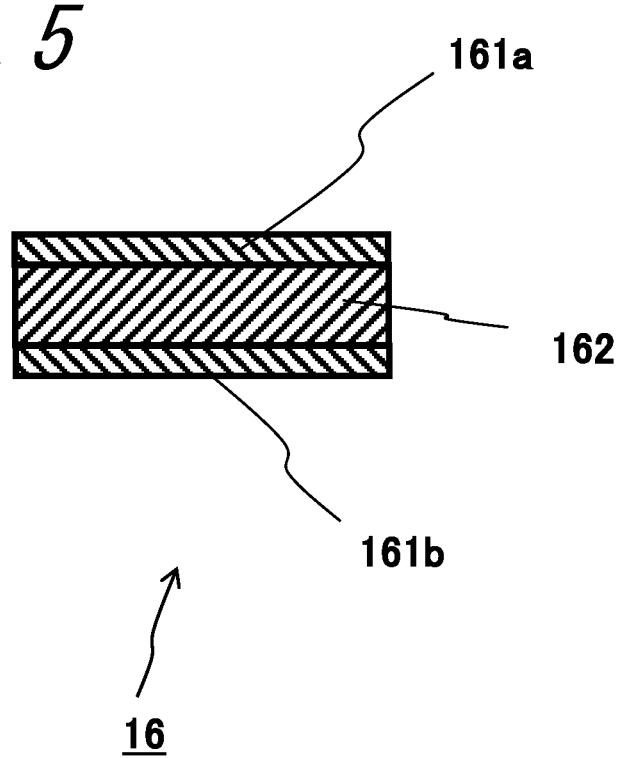
FIG. 5 is a cross-sectional view schematically illustrating a structure of a second connecting member 16 in FIGS. 1 to 3.

FIG. 5 is a cross-sectional view schematically illustrating a structure of the second connecting member 16. In FIG. 5, for easy understanding of a shape, a dimension of the second connecting member in a thickness direction thereof is enlarged to be shown. As shown in FIG. 5, the first connecting member 16 has a three-layer structure composed of two adhesive layers 161a and 161b and a base layer 162 disposed therebetween.

Further, one main surface (surface on the adhesive layer 161a side) of the second connecting member 16 is entirely fixed to the periphery of one main surface of the vibration plate 12, and the other main surface (surface on the adhesive layer 161b side) of the second connecting member 16 is entirely fixed to the support body 11 (casing 19). That is, the vibration plate 12 and the support body 11 (casing 19) are connected to each other through the second connecting member 16.

The adhesive layers 161a and 161b are formed of a viscoelastic body, and the thickness thereof is set to about 10 μm to 30 μm, for example. The base layer 162 has a high rigidity compared with the adhesive layers 161a and 161b, and the thickness thereof is set to about 50 μm to 200 μm, for example. The thickness of the second connecting member 16 is set so as to avoid excessive attenuation of vibration ascribable to too large a thickness. That is, the second connecting member 16 is formed to be able to transmit vibration of the vibration plate 12 to the support body 11 (casing 19). The adhesive layers 161a and 161b may be formed of the same material as in the above-described adhesive layers 131a and 131b. The base layer 162 may be formed of the same material as in the above-described base layer 132.

As the electronic circuit (not shown), for example, a circuit that processes image information to be displayed on the display 18 or sound information to be transmitted by the piezoelectric vibration device, a communication circuit, or the like may be exemplified. At least one of these circuits may be included, or all of these circuits may be included. Further, a circuit having a different function may be used. In addition, a plurality of electronic circuits may be included.

The display 18 is a display apparatus that includes a function of displaying image information, and for example, known displays such as a liquid crystal display, a plasma display or an organic EL display may be preferably used.

FIGS. 6(a) to 6(c) are cross-sectional views schematically illustrating a vibration state in the piezoelectric vibration device according to the embodiment. In FIGS. 6(a) to 6(c), the second connecting member 16, the support body 11, the display 18 and the electronic circuit are not shown.

As described above, in the piezoelectric vibration device of the embodiment, one main surface of the plate-like vibration element 14 capable of being independently subjected to bending vibration by application of an electric signal is connected to the vibration plate 12 through the first connecting member 13 that is at least partly formed of the viscoelastic body. Accordingly, if the vibration element 14 is subjected to bending vibration by application of an electric signal, the first connecting member 13 transmits vibration of the vibration element 14 to the vibration plate 12 while allowing vibration of the vibration element 14 by elastic deformation of the first connecting material 13. In this way, the piezoelectric vibration device of the embodiment is able to strongly vibrate the vibration plate 12 by application of an electric signal. That is, in the piezoelectric vibration device of the embodiment, it is possible to achieve a thin device compared with the piezoelectric vibration device in the related art, and to generate strong vibration even though the vibration element 14 is mounted to only one main surface of the vibration plate 12.

For example, in the state shown in FIG. 6(a), the vibration element 14 is bent to be convex upward in the figure, and the vibration plate 12 is bent to be convex upward but the bending amount of the vibration plate 12 is smaller than that of the vibration element 14. That is, the first connecting member 13 is deformed so that an interval between the vibration element 14 and the vibration plate 12 is small at its central portion and is large at its periphery.

Further, in the state shown in FIG. 6(c), the vibration element 14 is bent to be convex downward in the figure, and the vibration plate 12 is bent to be convex downward but the bending amount of the vibration plate 12 is smaller than that of the vibration element 14. That is, the first connecting member 13 is deformed so that an interval between the vibration element 14 and the vibration plate 12 is large at its central portion and is small at its periphery.

In this way, the vibration element 14 and the vibration plate 12 vibrate so that the magnitude relationship in the interval between the vibration element 14 and the vibration plate 12 at the central portion and the periphery in a region where the vibration member 14 and the vibration plate 12 face each other through the first connecting member 13 is periodically reversed by application of an electric signal. Thus, the degree of interruption of vibration of the vibration element 14 is reduced, and it is possible to strongly vibrate the vibration plate 12.

That is, in the piezoelectric vibration device of the embodiment, according to application of an electric signal, the vibration element 14 vibrates, and a portion of the vibration plate 12 to which the vibration element 14 is mounted vibrates with an amplitude smaller than that of the vibration element 14 due to deformation of the first connecting member 13. That is, in a region where the vibration plate 12 and the vibration element 14 face each other through the first connecting member 13, the vibration plate 12 vibrates with an amplitude smaller than that of the vibration element 14. Thus, it is possible to reduce interruption of vibration of the vibration element 14, and to strongly vibrate the vibration plate 12.

The amplitudes of the vibration plate 12 and the vibration element 14 may be measured using a laser Doppler vibrometer. That is, by irradiating the surface of the vibration plate 12 opposite to the surface thereof connected to the vibration element 14 with a laser of the laser Doppler vibrometer, it is possible to measure the amplitude of the vibration plate 12. Further, by irradiating the surface of the vibration element 14 opposite to the surface thereof connected to the vibration plate 12 with a laser of the laser Doppler vibrometer, it is possible to measure the amplitude of the vibration element 14. As the laser Doppler vibrometer, for example, LV-1710 manufactured by ONO SOKKI CO., LTD. may be used. Further, an FET analyzer is connected thereto to read a value of the amplitude displayed on a screen of a personal computer, thereby recognizing the amplitude. As the FET analyzer, for example, DS-0290 manufactured by ONO SOKKI CO., LTD. may be used.

Further, in the piezoelectric vibration device of the embodiment, since it is possible to reduce interruption of vibration of the vibration element 14 as the thickness of the first connecting member 13 is larger than the amplitudes of the bending vibration of the vibration element 14, it is possible to obtain a piezoelectric vibration device capable of strongly vibrating the vibration plate 12. It is preferable that the thickness of the first connecting member 13 is larger than the amplitudes of the vibration element 14 when the vibration element 14 independently vibrates.

Further, in the piezoelectric vibration device of the embodiment, the first connecting member 13 is formed of a material that is softer than that of the vibration plate 12 and is easy to be deformed, and is lower than the vibration plate 12 in an elastic modulus or rigidity such as a Young's modulus, a rigidity modulus or a volume elasticity modulus. That is, the first connecting member 13 is deformable, and is greatly deformed compared with the vibration plate 12 when the same force is applied thereto. Further, it is possible to reduce interruption of vibration of the vibration element 14 and to strongly vibrate the vibration plate 12.

Figure 6:
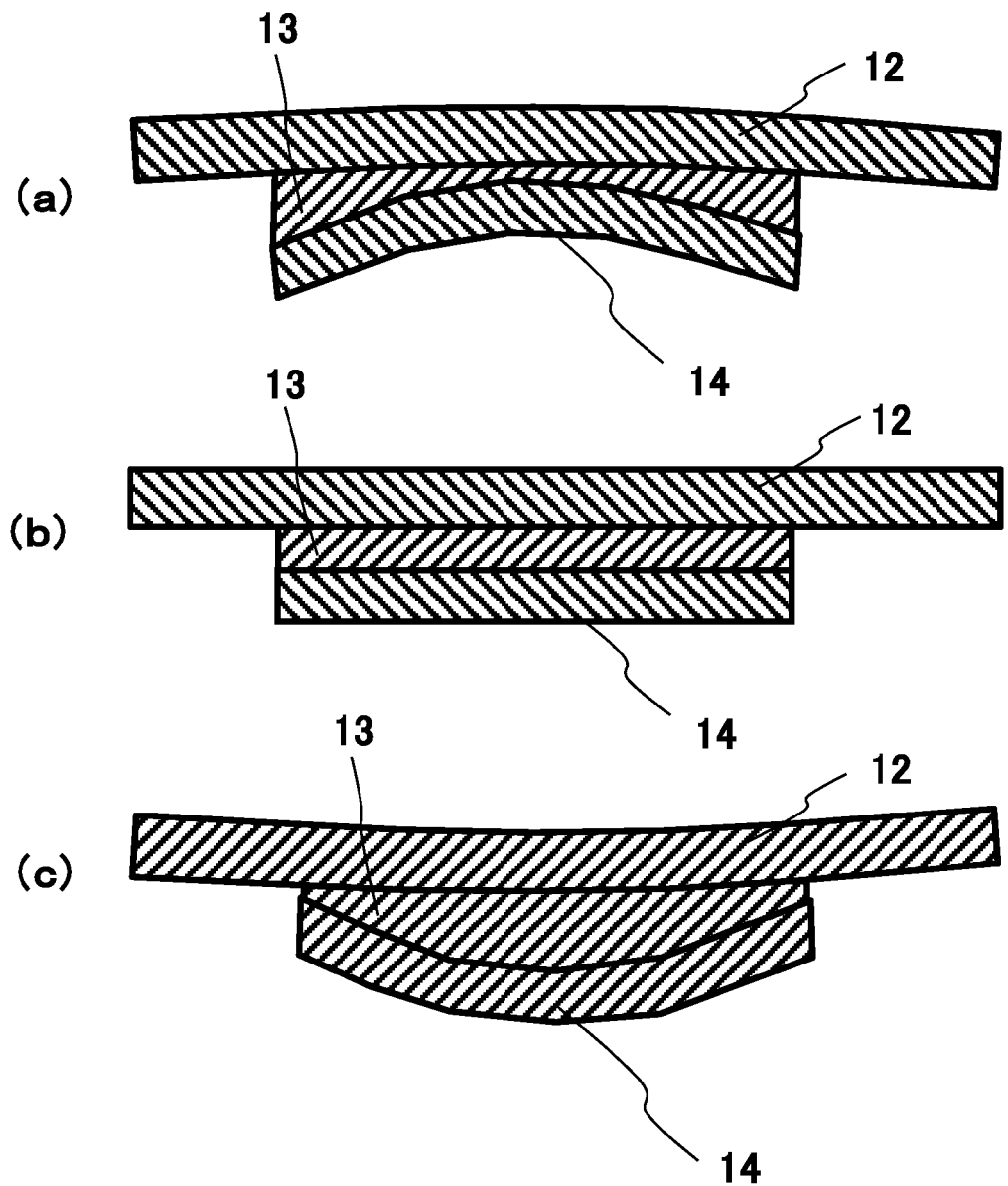
FIGS. 6(a) to 6(c) are cross-sectional views schematically illustrating a vibration state in the piezoelectric vibration device according to the embodiment of the invention.

For example, in a case where the first connecting member 13 is rigid and is hard to be deformed, the vibration element 14 and the vibration plate 12 vibrate with almost the same amplitude, but in this case, a problem arises in which vibration of the vibration element 14 is noticeably interrupted. It is hard to clearly specify the reason for the problem, but the reason may be presumed as follows. That is, for example, as shown in FIG. 6(*c*), in a case where the vibration element 14 is deformed to be convex downward, the upper half (on the vibration plate 12 side) of the vibration element 14 in the thickness direction shrinks in the length direction. Then, the vibration plate 12 connected to the upper half (on the vibration plate 12 side) of the vibration element 14 in the thickness direction tries to be deformed to be convex upward. Accordingly, the direction that the vibration element 14 tries to be bent and the direction that the vibration plate 12 tries to be bent become opposite to each other, and thus, vibration of the vibration element 14 is interrupted due to stress generated at this time, and vibration of the vibration plate 12 becomes weak. In the piezoelectric vibration device of the embodiment, since the first connecting member 13 is formed of a material that is softer than that of the vibration plate 12 and is easy to be deformed, it is possible to reduce interruption of vibration of the vibration element 14 and to strongly vibrate the vibration plate 12.

In the piezoelectric vibration device of the embodiment, one main surface of the vibration element 14 capable of being independently subjected to bending vibration by application of an electric signal is connected to one main surface of the vibration plate 12 through the first connecting member 13 that is at least partly formed of the viscoelastic body. In the piezoelectric vibration device of the embodiment having such a configuration, it is possible to alleviate thermal stress that acts between both the vibration plate 12 and the vibration element 14 and the first connecting member 13 (stress that acts between two objects having different thermal expansion coefficients depending on temperature change) by deformation of the viscoelastic body, using the property of the viscoelastic body that elasticity is strong with respect to fast movement and viscosity is strong with respect to slow movement, and to transmit vibration of the vibration element 14 in which the displacement direction is reversed in a very short time to the vibration plate 12 without attenuation. Thus, it is possible to achieve a piezoelectric vibration device that is capable of generating strong vibration and is hard to be damaged.

Further, since the main surface of the vibration element 14 is entirely fixed to the main surface of the first connecting member 13 and the main surface of the first connecting member 13 is entirely fixed to the vibration plate 12, it is possible to prevent stress that acts between both the vibration plate 12 and the vibration element 14 and the first connecting member 13 when an impact is received from being concentrated on a small area. Thus, it is further possible to achieve a piezoelectric vibration device that is hard to be damaged.

Further, in the piezoelectric vibration device of the embodiment, the first connecting member 13 includes the base layer 132 and the adhesive layers 131*a* and 131*b* that are formed of the viscoelastic body. According to this configuration, by securing the thickness by the base layer 132, it is possible to easily set the thickness of the first connecting member 13 to be larger than the amplitudes of bending vibration of the vibration element 14. Further, it is possible to alleviate thermal stress or the like by deformation of the adhesive layers 131*a* and 131*b*, and to transmit vibration of the vibration element 14 to the vibration plate 12 to generate strong vibration without interruption of vibration of the vibration element 14 by elastic deformation of the adhesive layers 131*a* and 131*b*. Thus, it is possible to achieve a piezoelectric vibration device that is capable of generating strong vibration and is hard to be damaged. Here, by setting the thickness of the base layer 132 to be larger than the amplitudes of bending vibration of the vibration element 14, it is possible to reliably set the thickness of the first connecting member 13 to be larger than the amplitudes of bending vibration of the vibration element 14. Further, by setting the rigidity of the base layer 132 to be higher than that of the adhesive layers 131*a* and 131*b*, it is possible to easily maintain the shape and dimension of the first connecting member 13 by the base layer 132.

Further, in the piezoelectric vibration device of the embodiment, the first connecting member 13 has a three-layer structure composed of the two adhesive layers 131*a* and 131*b* and the base layer 132 disposed therebetween. Further, the surface of the adhesive layer 131*a* is connected to the vibration plate 12, and the surface of the adhesive layer 131*b* is connected to the vibration element 14. According to this configuration, it is possible to reliably alleviate both the thermal stress that acts between the vibration plate 12 and the first connecting member 13 and the thermal stress that acts between the vibration element 14 and the first connecting member 13. Thus, it is further possible to achieve a piezoelectric vibration device that is hard to be damaged.

Further, in the piezoelectric vibration device of the embodiment, it is preferable that the base layer 132 is formed of a non-woven fabric and an adhesive material, and specifically, a material in which the adhesive material (viscoelastic body) is impregnated between fibers of the non-woven fabric (material in which the adhesive material (viscoelastic body) is present between fibers of the non-woven fabric). Further, it is preferable that at least a part of the base layer 132 is formed of the adhesive material (viscoelastic body) throughout the thickness thereof (a direction directed from one of two adhesive layers 131*a* and 131*b* to the other thereof). That is, it is preferable that at least a part of the first connecting member 13 is formed of the viscoelastic body throughout the thickness direction thereof (a direction directed from one of the two adhesive layers 131a and 131b to the other thereof, that is, a direction directed from one of the vibration element 14 and the vibration plate 12 to the other thereof). That is, it is preferable that the viscoelastic body is present in any cross section between the surface on the vibration element 14 side of the first connecting member 13 and the surface on the vibration plate 12 side of the first connecting member 13. Thus, it is possible to enhance both the effect of alleviating thermal stress that acts between the vibration plate 12 and the vibration element 14 and the effect of transmitting vibration of the vibration element 14 to the vibration plate 12.

Further, it is important that the vibration element 14 is independently subjected to bending vibration. Thus, it is possible to reduce vibration attenuation due to the non-woven fabric, compared with a case where the vibration element 14 is subjected to stretching vibration. Further, it is preferable that the thicknesses of the vibration element 14 and the vibration plate 12 are equal (substantially equal) to each other and the first connecting member 13 is positioned at a central portion in the vibrating direction of a composite body composed of the vibration element 14, the vibration plate 12 and the first connecting member 13. Thus, it is possible to reduce vibration attenuation due to the first connecting member 13. Further, it is preferable that the thicknesses of the adhesive layers 131a and 131b are equal to each other and the base layer 132 is positioned at the central portion in the vibrating direction of the composite body composed of the vibration element 14, the vibration plate 12 and the first connecting member 13. Thus, it is possible to reduce vibration attenuation due to the base layer 132 (non-woven fabric constituting the base layer 132).

Further, in the piezoelectric vibration device of the embodiment, the vibration plate 12 is fixed to the support body 11 through the second connecting member 16 that is at least partly formed of the viscoelastic body and that is capable of transmitting vibration. Thus, it is possible to transmit vibration of the vibration plate 12 to the support body 11 while alleviating thermal stress between the vibration plate 12 and the support body 11, and the second connecting member 16 by the viscoelastic body. Thus, it is possible to achieve a piezoelectric vibration device in which occurrence of damage of the vibration plate 12 or the support body 11 due to thermal stress is reduced and the vibration element 14, the vibration plate 12 and the support body 11 vibrate together. Thus, mass of a vibrating object becomes large and vibrating energy becomes large, and thus, it is possible to achieve a piezoelectric vibration device capable of generating strong vibration in which vibration attenuation is small even in a case where the vibration plate 12 makes contact with a different object, that is, a piezoelectric vibration device suitable for transmitting sound information by making contact with the ear directly or indirectly to transmit vibration to a cartilage of the ear with the vibration plate 12.

Further, the portable terminal of the embodiment includes the electronic circuit (not shown), the display 18, and the casing 19 that accommodates the electronic circuit and the like, in addition to the piezoelectric vibration device. Further, the vibration plate 12 is the cover of the display 18, and the casing 19 functions as the support body 11 of the piezoelectric vibration device. Since the portable terminal of the embodiment having such a configuration includes the piezoelectric vibration device that is capable of generating strong vibration and is hard to be damaged, it is possible to achieve a portable terminal that is capable of generating strong vibration and is hard to be broken down. Further, since it is not necessary to mount the vibration element 14 on the surface of the vibration plate 12 that is the cover of the display 18, it is possible to achieve a portable terminal having a good appearance.

Further, the portable terminal of the embodiment transmits sound information by making contact with the ear directly or through a different object to transmit vibration to a cartilage of the ear with the vibration plate 12 or the casing 19. That is, the portable terminal of the embodiment transmits sound information by making contact with the ear directly or indirectly to transmit vibration to a cartilage of the ear with the vibration plate 12 or the casing 19. Thus, it is possible to achieve a portable terminal capable of transmitting sound information even in a noisy environment, for example. The object interposed between the vibration plate 12 or the casing 19 and the ear may be a cover of the portable terminal, or may be a headphone or an earphone, for example. As long as the object is capable of transmitting vibration, anything may be used.

Modified Examples

The invention is not limited to the above-described embodiments, and various changes and modifications may be made in a range without departing from the scope of the invention.

For example, in the above-described embodiment, an example in which the cover of the display 18 is the vibration plate 12 has been described, but the invention is not limited thereto. For example, the entirety of the display 18 or a part of the display 18 may be used to function as the vibration plate 12.

Further, in the above-described embodiment, an example in which the casing 19 of the portable terminal functions as the support body 11 of the piezoelectric vibration device has been described, but the invention is not limited thereto. For example, a part of the casing 19 may function as the support body 11 of the piezoelectric vibration device, or a configuration in which the support body 11 of the piezoelectric vibration device is mounted to the casing 19 may be used.

Further, in the above-described embodiment, an example in which the first connecting member 13 includes the adhesive layers 131a and 131b and the base layer 132 and the second connecting member 16 includes the adhesive layers 161a and 161b and the base layer 162 has been described, but the invention is not limited thereto. For example, the first connecting member 13 may be formed of a viscoelastic body only. This is similarly applied to the second connecting member 16.

Further, in the above-described embodiment, an example in which the rigidity of the base layer 132 is higher than that of the adhesive layers 131a and 131b and the rigidity of the base layer 162 is higher than that of the adhesive layers 161a and 161b has been described, but the invention is not limited thereto. In a case where the rigidity of the adhesive layers 131a and 131b is sufficiently high, the rigidity of the base layer 132 may be lower than that of the adhesive layers. Similarly, in a case where the rigidity of the adhesive layers 161a and 161b is sufficiently high, the rigidity of the base layer 162 may be lower than that of the adhesive layers.

Further, in the above-described embodiment, an example in which the vibration element 14 is configured by a piezoelectric bimorph element has been described, but the invention is not limited thereto. The vibration element 14 may be configured by any element having the function of being independently subjected to bending vibration by application of an electric signal. Accordingly, for example, the vibration element 14 may have a unimorph structure in which a metallic plate is bonded to a piezoelectric body that is subjected to stretching vibration by application of an electric signal. Further, for example, the vibration element 14 may have a unimorph structure in which a piezoelectric body that is subjected to stretching vibration and a piezoelectric body that is not subjected to stretching vibration by application of an electric signal are connected to each other.

Example

Next, a specific example of the piezoelectric vibration device of the invention will be described. A characteristic of a piezoelectric vibration device according to the first embodiment of the invention shown in FIGS. 1 to 3 was measured.

First, the vibration element 14 was mounted at a position of an electromagnetic receiver on a rear surface of a liquid crystal display cover of a mobile phone, to manufacture a piezoelectric vibration device according to the embodiment of the invention, shown in FIGS. 1 to 3. The vibration plate 12 employed the liquid crystal display cover as such, and the casing 19 (support body 11) and the display 18 also employed components of the mobile phone as such. The vibration plate 12 was formed of an acrylic resin with a length of 95 mm, a width of 48 mm and a thickness of 0.5 mm. The vibration element 14 was set to have a rectangular parallelepiped shape of 23.5 mm in length, 3.3 mm in width, and 0.5 mm in thickness. Further, the vibration element 14 had a structure in which the piezoelectric layers and the electrode layers having a thickness of about 30 μm were alternately stacked, and the total number of the piezoelectric layers was set to 16. The piezoelectric layer was formed of lead zirconate titanate (PZT) in which Zr was replaced in part with Sb. The adhesive layers 131a and 131b of the first connecting member 13 were formed of an acryl-based adhesive, and the base layer 132 thereof was formed of a non-woven fabric and an acryl-based adhesive. The first connecting member 13 had a thickness of 0.16 mm, and was attached to the entire surface of one main surface of the vibration element 14. As the second connecting member 16, the adhesive layers 161a and 161b were formed of an acryl-based adhesive, and the base layer 162 of a foam was used. The casing 19 (support body 11) was formed of a synthetic resin.

Figure 7:
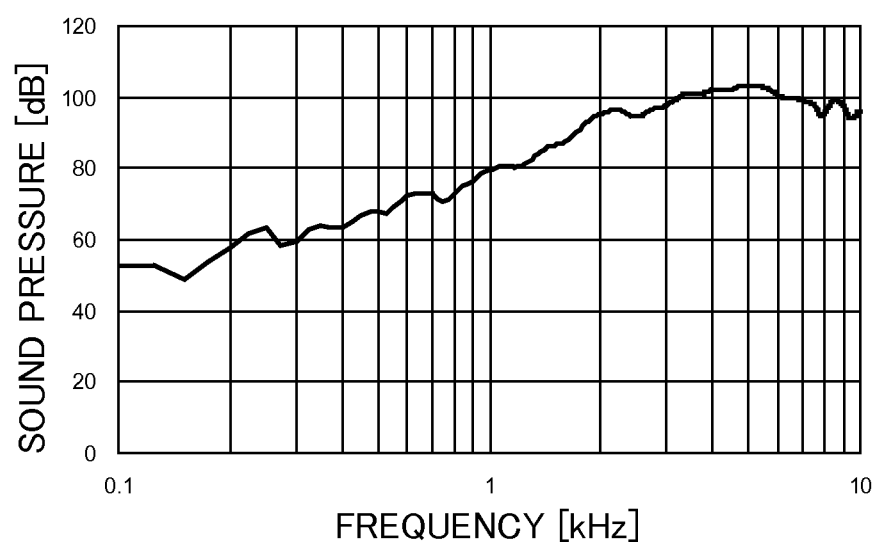
FIG. 7 is a graph illustrating a measurement result of a characteristic of the piezoelectric vibration device according to the embodiment of the invention.

Then, a frequency characteristic of sound pressure of the manufactured piezoelectric vibration device was evaluated. In evaluation, a silicone rubber having a thickness of 2 mm and the same area as that of the vibration plate 12 was disposed on the vibration plate 12, and a microphone was pressed to be mounted at a position directly above the vibration element 14 on an upper surface of the silicone rubber. Further, a sine wave signal having an effective value of 3.0 V was inputted to the vibration element 14, and sound pressure detected by the microphone was evaluated. The result is shown in FIG. 7. In the graph of FIG. 7, the horizontal axis represents frequency, and the vertical axis represents sound pressure. According to the graph shown in FIG. 7, it is confirmed that high sound pressure exceeding 40 dB in a wide frequency wave is obtained. Thus, effectiveness of the invention was confirmed.

REFERENCE SIGNS LIST

11: Support body
12: Vibration plate
13: First connecting member
131a, 131b, 161a, 161b: Adhesive layer
132, 162: Base layer
14: Vibration element
16: Second connecting member
18: Display
19: Casing

The invention claimed is:

1. A piezoelectric vibration device, comprising at least:
a support body;
a vibration member that is mounted to the support body to be able to vibrate;
a vibration element capable of being independently subjected to bending vibration by application of an electric signal; and
a deformable first connecting member that is disposed between a first surface of the vibration element that is a bending surface and one main surface of the vibration member; and connects the first surface of the vibration element and the one main surface of the vibration member, wherein
the deformable first connecting member has a three-layer structure composed of two adhesive layers and a base layer disposed between the two adhesive layers, the two adhesive layers each being formed of a viscoelastic body, the base layer being in contact with both of the two adhesive layers,
the base layer is formed of a non-woven fabric and the viscoelastic body, and the viscoelastic body is impregnated between fibers of the non-woven fabric, and
a thickness of the base layer is larger than amplitudes of the bending vibration of the vibration element.

2. The piezoelectric vibration device according to claim 1, wherein the deformable first connecting member is configured so that the viscoelastic body is present in any cross section between a surface on the vibration element side of the deformable first connecting member and a surface on the vibration member side of the deformable first connecting member.

3. The piezoelectric vibration device according to claim 1, comprising a second connecting member that is at least partly formed of a viscoelastic body, the vibration member being fixed to the support body through the second connecting member.

4. A portable terminal, comprising at least:
an electronic circuit;
a display;
the piezoelectric vibration device according to claim 1; and
a casing,
the vibration member being the display, a part of the display, or a cover of the display, and the support body being fixed to the casing or at least a part of the casing being the support body.

5. The portable terminal according to claim 4, wherein the vibration member or the casing makes contact with an ear directly or through a different object to transmit sound information.

6. The portable terminal according to claim 4, wherein the vibration element has a shape elongated in the first direction,
the vibration member is bent by the vibration element such that a portion of the vibration member which is located immediately above the vibration element is raised highest in the first direction as compared with circumference of the portion of the vibration member, and
an ear which is in contact with the vibration member vibrates to transmit sound.

* * * * *